United States Patent
Gotoda

(10) Patent No.: US 6,690,688 B2
(45) Date of Patent: Feb. 10, 2004

(54) VARIABLE WAVELENGTH SEMICONDUCTOR LASER AND OPTICAL MODULE

(75) Inventor: Mitsunobu Gotoda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/156,638

(22) Filed: May 29, 2002

(65) Prior Publication Data

US 2003/0007524 A1 Jan. 9, 2003

(30) Foreign Application Priority Data

Jul. 4, 2001 (JP) .......................... 2001-203453

(51) Int. Cl.$^7$ ................................ H01S 3/10
(52) U.S. Cl. .................. 372/20; 372/43; 372/44; 372/50; 372/99; 372/101; 372/102
(58) Field of Search ................. 372/20, 43, 44, 372/50, 99, 102, 101

(56) References Cited

U.S. PATENT DOCUMENTS

| | | | | |
|---|---|---|---|---|
| 5,325,392 A | * | 6/1994 | Tohmori et al. | 372/96 |
| 5,602,866 A | * | 2/1997 | Fukunaga | 372/96 |
| 5,661,835 A | * | 8/1997 | Kato et al. | 385/92 |
| 5,699,377 A | * | 12/1997 | Pan | 372/92 |
| 5,757,828 A | * | 5/1998 | Ouchi | 372/27 |
| 5,835,261 A | * | 11/1998 | Tamanuki et al. | 359/344 |
| 5,841,799 A | * | 11/1998 | Hiroki | 372/19 |
| 5,937,120 A | * | 8/1999 | Higashi | 385/49 |
| 6,243,404 B1 | * | 6/2001 | Joyce | 372/34 |
| 6,526,075 B2 | * | 2/2003 | Mizutani | 372/27 |

FOREIGN PATENT DOCUMENTS

WO   WO 0203516   1/2002

OTHER PUBLICATIONS

Jayaraman et al., "Theory, Design, And Performance Of Extended Tuning Range Semiconductor Lasers With Sampled Gratings", IEEE Journal of Quantum Electronics, vol. 29, No. 6, Jun. 1993, pp. 1824–1834.

Ishii et al., "Super Structure Grating (SSG) For Broadly Tunable DBR Lasers", IEEE Photonics Technology Letters, vol. PTL-5, 1993, pp. 393–395.

Mason et al., "Design Of Sampled Grating DBR Lasers With Integrated Semiconductor Optical Amplifiers", IEEE Photonics Technology Letters, vol. 12, No. 7, Jul. 2000, pp. 762–764.

* cited by examiner

Primary Examiner—Paul Ip
Assistant Examiner—Delma R. Flores Ruiz
(74) Attorney, Agent, or Firm—Leydig, Voit & Mayer, Ltd.

(57) ABSTRACT

A wavelength-tunable semiconductor laser includes a semiconductor substrate; an optical waveguide on an upper surface of the semiconductor substrate; a front light reflection area including an SG-DBR mirror with repeating pairs of a diffraction grating portion and a non-diffraction grating portion over plural periods; a rear light reflection area including an SSG-DBR mirror achieved with repeating portions in which the pitch of a diffraction grating pitch regularly varies from one end to the other end; an active region including an active layer between the front light reflection area and the rear light reflection area; and a phase control area between the front light reflection area and the rear light reflection area and including a phase control layer with a refractive index varied by current injection.

6 Claims, 13 Drawing Sheets

VARIABLE WAVELENGTH SEMICONDUCTOR LASER AND OPTICAL MODULE

BACKGROUND OF THE INVENTION

1. Field of the Invention

The present invention relates to a broad-band wavelength-tunable semiconductor laser needed in an optical fiber communication technique used for a telephone exchange network of a trunk line or the like, particularly a wavelength division multiplexing system that simultaneously uses laser beams having different wavelengths for signal transmission, and, more particularly, to a wavelength-tunable semiconductor laser having an optical waveguide with a front light reflection area comprising a sampled grating mirror and a rear light reflection area comprising a super-structure-grating mirror that are located before and after an active region, respectively, and an optical module using the wavelength-tunable semiconductor laser as a light source.

2. Description of the Related Art

An SSG-DBR wavelength-tunable semiconductor laser using a so-called SSG (Super-Structure-Grating) DBR (Distributed Bragg Reflectors) as a diffraction grating is known as one of the wavelength-tunable semiconductor lasers having a conventional multiple-electrode DBR structure.

FIG. 11 is a schematic diagram showing the structure of a conventional SSG-DBR wavelength-tunable semiconductor laser reported by H. Ishii et. al. in IEEE Journal of Quantum Electronics, vol. 32, No. 3, 1996, pp 433–441, and, more particularly, FIG. 11 shows a cross-sectional view of a wavelength-tunable semiconductor laser in the direction parallel to the optical axis.

In FIG. 11, reference numeral 1 represents an active region; 2, a front light reflection area; 3, a rear light reflection area; 4, a phase control area; 5, an optical waveguide formed of InGaAsP; 6, an n-type InP substrate; 7, an n-type InP cladding layer; 8, a p-type InP cladding layer; 9, a p-type InGaAsP contact layer; 13, an n-type electrode; 14a, 14b, 14c, 14d, p-type electrodes; 15, a laser beam emitted from the front facet of an optical resonator; and 21, 22, the pitch variations of the diffraction grating (i.e., one period of modulation) of each of a front SSG-DBR mirror and a rear SSG-DBR mirror, respectively.

Here, the SSG-DBR mirror has the following periodic structure. That is, when in a structure having both the ends spaced at a predetermined distance, the pitch of the diffraction grating in the structure is linearly and continuously varied (linearly chirped) from $\Lambda_a$ to $\Lambda_b$ in the direction from one end to the other end, and the structure is set as one period $\Lambda_s$, the above structure of one period $\Lambda_s$ is repeated by plural periods ($\Lambda_s$) to thereby achieve the periodic structure. The reflection peak spectrum of the SSG-DBR mirror has plural reflection peaks at a wavelength interval of $\delta\lambda = \lambda_0^2/(2n_{eq}X\Lambda_s)$ over the wavelength range from $\lambda_a = 2n_{eq}X\Lambda_a$ to $\lambda_b = 2n_{eq}X\Lambda_b$. Here, $n_{eq}$ represents the equivalent refractive index of the optical waveguide, and $\lambda_0$ represents the center wavelength.

In the front SSG-DBR mirror constituting the front light reflection area 2 and the rear SSG-DBR mirror constituting the rear light reflection area 3 of the conventional wavelength-tunable semiconductor laser, one period 21 of the front SSG-DBR mirror and one period 22 of the rear SSG-DBR mirror are respectively repeated by plural periods in FIG. 11 (the repetitive arrangement is not shown in FIG. 11). The SSG-DBR wavelength-tunable semiconductor laser is designed so that the wavelength intervals of the reflection peaks of the front and rear SSG-DBR mirrors are slightly different from each other by using a method of varying the distance of the one period 22 with respect to the distance of the one period 21 above-mentioned.

Next, the operation of the conventional SSG-DBR wavelength-tunable semiconductor laser shown in FIG. 11 will be described.

As shown in FIG. 11, the active region 1, the front light reflection area 2, the rear light reflection area 3, and the phase control area 4 are integrated into the optical waveguide 5. P-type electrodes 14a, 14b, 14c, 14d, which are electrically separated from one another, are located in the respective areas. Active-layer current is injected into the active region 1 by applying a forward bias voltage across the p-type electrode 14b opposite the active region 1 and the n-type electrode 13 located at the rear surface side of the semiconductor substrate, whereby spontaneous emission light having a broad wavelength range is emitted.

The spontaneous emission light is repetitively reflected and amplified by the front SSG-DBR mirror located in the front light reflection area 2 and the rear SSG-DBR mirror located in the rear light reflection region 3 while it propagates in the optical waveguide 5 located in the optical resonator, and laser beams having one wavelength are controlled to be finally selected by controlling refractive index of each area due to current injection to the front light reflection area 2 and/or the rear light reflection area 3 and the phase control area 4, whereby laser oscillation at a single wavelength is achieved with a threshold current.

The laser oscillation wavelength control of the conventional wavelength-tunable semiconductor laser will be described in more detail.

FIG. 12A shows reflection peak spectra of the front SSG-DBR mirror and the rear SSG-DBR mirror formed in the front light reflection area 2 and the rear light reflection area 3 when no current is injected into these areas 2 and 3. FIG. 12B shows the comparison between the reflection peak spectrum of the rear SSG-DBR mirror when current is injected into the rear light reflection area 3 and the reflection peak spectrum of the front SSG-DBR mirror when no current is injected into the front light reflection area 2. In FIGS. 12A and 12B, the abscissa represents the wavelength and the ordinate represents the reflectivity. Further, $\lambda_1$ represents the wavelength at which the reflection peaks of the front and rear SSG-DBR mirrors are coincident when no current is injected into each of the front light reflection area 2 and the rear light reflection area 3, and $\lambda_2$ represents the wavelength at which the reflection peaks of the front and rear SSG-DBR mirrors are coincident when current is injected into the rear light reflection area 3. These reflection peak spectra comprise plural reflection peaks that are different in intensity from each other and have extremely narrow line widths, which is the general characteristic of the SSG-DBR wavelength-tunable semiconductor laser.

As described above, in the initial state when both the front SSG-DBR mirror control current and the rear SSG-DBR mirror control current are equal to zero, the wavelength at which the reflection peaks of the front and rear SSG-DBR mirrors in the front light reflection area 2 and the rear light reflection area 3 respectively are coincident with each other is equal to $\lambda_1$. As a result, the light having the wavelength $\lambda_1$ is strongly reflected from the front and rear SSG-DBR mirrors, so that the loss of light beams at the wavelength $\lambda_1$ is much smaller than light beams having the other wavelengths. That is, the gain of light at the wavelength $\lambda_1$ is relatively increased as compared with the gain of light at the other wavelengths, so that the wavelength-tunable semiconductor laser starts laser oscillation at the wavelength $\lambda_1$. The reason why the reflection peaks of the front and rear SSG-DBR mirrors are coincident with each other at only the wavelength $\lambda_1$ and the other reflection peaks at the other wavelengths are not coincident with each other resides in that a minute displacement occurs in the wavelength interval of the reflection peak spectrum between the front and rear mirrors due to the difference in pitch of the diffraction grating which is caused by the difference in distance between the respective periods 21 and 22 and thus the reflection peaks are coincident with each other at only a specific place, like graduations of a vernier.

In order to tune the laser oscillation wavelength of the SSG-DBR wavelength-tunable semiconductor laser, a forward bias voltage is applied to any one of or both the front light reflection area 2 and the rear light reflection area 3 to inject current into the area(s), thereby equivalently varying the refractive index of the front light reflection area 2 and/or the rear light reflection area 3 through the current injection as shown in FIG. 12B. When the refractive index is varied by the current injection, the wavelength at which the gain is relatively larger is shifted to the short wavelength side. The light having this wavelength is amplified while propagating through the optical waveguide 5, and finally induces laser oscillation at the wavelength $\lambda_2$ at which the reflection peaks of the front and rear SSG-DBR mirrors are coincident with each other. By using this method, that is, by injecting current into the light reflection area having the SSG-DBR mirror formed therein and controlling the current injection level to intentionally vary the refractive index of the light reflection area, the laser oscillation wavelength of the wavelength-tunable semiconductor laser can be tuned with high controllability. The advantage of the SSG-DBR mirror resides in that each reflection peak intensity is relatively high. Particularly, this effect is more remarkable to an SG-DBR mirror described later.

A sampled grating DBR, that is, SG-DBR reported by V. Jayaraman et al. in IEEE Journal of Quantum Electronics, vol. 29, No. 6, 1993, pp. 1824–1834, is known as a mirror for a wavelength-tunable semiconductor laser which is similar to SSG-DBR. Here, SG-DBR means the following repetitive structure. That is, when a portion comprising a diffraction grating portion and a non-diffraction grating portion is set as one period, this structure is repeated by plural periods to thereby achieve a repetitive structure. The diffraction grating of the diffraction grating portion has an ordinary uniform pitch.

FIG. 13 shows the sectional structure of an SG-DBR wavelength-tunable semiconductor laser.

The SG-DBR wavelength-tunable semiconductor laser is different from the SSG-DBR wavelength-tunable semiconductor laser described above only in that the mirrors constituting the front and rear light reflection areas 2 and 3 are SG-DBR mirrors. The characteristic of the SG-DBR mirror resides in that since a diffraction grating portion and a non-diffraction grating portion is set as one period and this paired structure is repeated over plural periods to form the light reflection area, periodic reflection peaks occur in the reflection peak spectrum. In a light reflection area comprising only a diffraction grating having an ordinary uniform pitch, that is, in a DBR mirror, only one reflection peak occurs. Both the SG-DBR mirror and the DBR mirror are remarkably different in this point. However, in the SG-DBR mirror, each reflection peak intensity is not so high, and the respective reflection peaks are different in intensity. Specifically, the reflection peak spectrum of the SG-DBR mirror exhibits a spectral shape that is monotonically reduced in the direction from the center reflection peak to both the sides.

FIG. 12 shows the wavelength-dependence of the reflection peaks of the front and rear SSG-DBR mirrors in the conventional SSG-DBR wavelength-tunable semiconductor laser. As described above, the SSG-DBR wavelength-tunable semiconductor laser is designed so that the wavelength intervals of the reflection peaks of the front and rear SSG-DBR mirrors are made mutually slightly different from each other by using the method of varying the distance of the one period 22 of the rear light reflection area 3 with respect to the distance of the one period 21 of the front light reflection area 2 or the like. That is, the laser oscillation wavelength is varied by using the method of injecting current into the front and rear SSG-DBR mirror areas, that is, the front light reflection area 2 and the rear light reflection area 3 to reduce the refractive index and shift the reflection peaks to the short wavelength side, thereby tuning the wavelength at which the reflection peaks of the front and rear SSG-DBR mirrors are coincident with each other, that is, by using the method utilizing a so-called vernier effect.

However, the reflection peak intensity randomly varies every SSG mode, and thus when the laser oscillation wavelength is tuned by using the vernier effect as described above, an inter-mode competition against the laser oscillation in another SSG mode which is not originally intended may occur. Accordingly, when the injection current ($i_f$) to the front SSG-DBR mirror and the injection current ($i_r$) to the rear SSG-DBR mirror are varied, the laser oscillation wavelength may irregularly vary due to variation of the temperature of the device or the injection current, with high probability. Further, the random variation of the reflection peak intensity induces such a problem that it is difficult to tune the laser oscillation wavelength continuously in some wavelength range.

In the conventional SSG-DBR wavelength-tunable semiconductor laser, the uniformity of the reflection peak intensity can be enhanced by increasing the repetitive period of the one period 21, 22 of the diffraction grating constituting the SSG-DBR mirror to sufficiently increase the reflectivity. In this case, however, if the reflectivity of the front SSG-DBR mirror is set to a high value, there would occur such a problem that the laser beam output which can be taken out to the outside is reduced, and the differential quantum efficiency is also reduced. Further, if the front light reflection area 2 is lengthened, there would newly occur such a problem that the laser oscillation line width is broadened due to a free-carrier absorption effect or carrier recombination effect when the current injection is carried out.

When the front and rear light reflection areas are SG-DBR mirrors, high reflection peak intensity can not be achieved for each reflection peak as compared with the SSG-DBR mirror structure. In addition, the reflection peak intensity is monotonically reduced from the center reflection peak to both the sides, and thus the reflection peak spectrum is not flat over the overall wavelength range, so that there is a problem that the wavelength-tunable range is narrower than that of the SSG-DBR mirror.

Further, in order to transmit a laser beam to a farther place through an optical fiber by using a wavelength-tunable semiconductor laser, it has been practically preferable that maximum light output power is achieved to overcome the optical loss in the optical fiber.

SUMMARY OF THE INVENTION

The present invention has been implemented to overcome the problems occurring in the conventional wavelength-tunable semiconductor laser, and has an object to provide a wavelength-tunable semiconductor laser having wavelength stability when the wavelength is tuned, and excellent device characteristics such as low threshold current, high optical output power operation, etc. Further, another object of the present invention is to provide an optical module having excellent wavelength stability and excellent characteristics such as high optical output power, etc.

In order to attain the above objects, according to an aspect of the present invention, the wavelength-tunable semiconductor laser includes: a semiconductor substrate; an optical waveguide provided over the upper surface of the semiconductor substrate; a front light reflection area that is provided at the front side in a laser beam emission direction by a part of the optical waveguide and comprises an SG-DBR mirror achieved by structurally repeating a portion comprising a pair of diffraction grating portion and a non-diffraction grating portion over plural periods on the assumption that the portion is set as one period; a rear light reflection area that is provided at the rear side in the laser beam emission direction by a part of the optical waveguide and comprises an SSG-DBR mirror achieved by structurally repeating, over plural periods, a portion in which the pitch of a diffraction grating pitch regularly varies from one end to the other end, both the ends being spaced at a predetermined distance, on the assumption that the portion is set as one period; an active region comprising an active layer provided between the front light reflection area and the rear light reflection area by a part of the optical waveguide; and a phase control area that is provided between the front light reflection area and the rear light reflection area by a part of the optical waveguide, and comprises a phase control layer whose refractive index is varied by current injection. Accordingly, the wavelength-tunable semiconductor laser has excellent wavelength stability when the wavelength is tuned.

According to another aspect of the present invention, the optical module includes: a wavelength-tunable semiconductor laser including a semiconductor substrate, an optical waveguide provided over the upper surface of the semiconductor substrate, a front light reflection area that is provided at the front side in a laser beam emission direction by a part of the optical waveguide and comprises an SG-DBR mirror achieved by structurally repeating a portion comprising a pair of diffraction grating portion and a non-diffraction grating portion over plural periods on the assumption that the portion is set as one period, a rear light reflection area that is provided at the rear side in the laser beam emission direction by a part of the optical waveguide and comprises an SSG-DBR mirror achieved by structurally repeating, over plural periods, a portion in which the pitch of a diffraction grating pitch regularly varies from one end to the other end, both the ends being spaced at a predetermined distance, on the assumption that the portion is set as one period, an active region comprising an active layer provided between the front light reflection area and the rear light reflection area by a part of the optical waveguide, and a phase control area that is provided between the front light reflection area and the rear light reflection area by a part of the optical waveguide, and comprises a phase control layer whose refractive index is varied by current injection; a focusing lens for focusing laser beams emitted from the wavelength-tunable semiconductor laser; an optical fiber for guiding the laser beams thus focused, and a housing in which the wavelength-tunable semiconductor laser, the focusing lens and the optical fiber are fixed. Accordingly, the laser beams having excellent wavelength stability can be achieved as an optical fiber output.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Preferred embodiments according to the present invention will be described hereunder with reference to the accompanying drawings.

[First Embodiment]

Figure 1A:
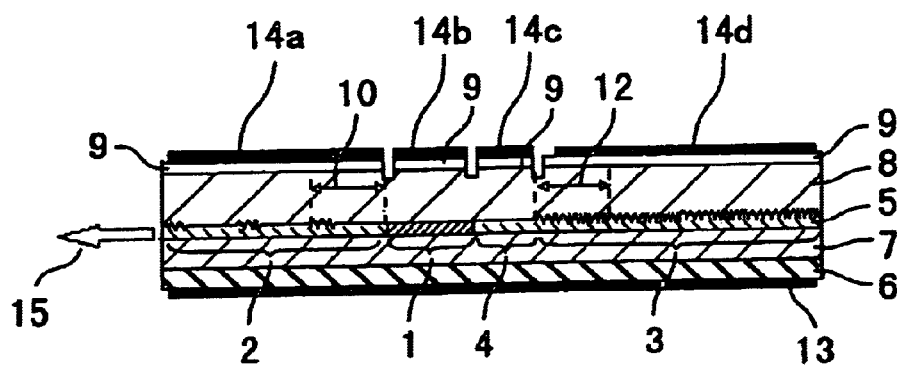
FIG. 1A is a cross-sectional view showing a device structure of a wavelength-tunable semiconductor laser according to a first embodiment.
Figure 1B:
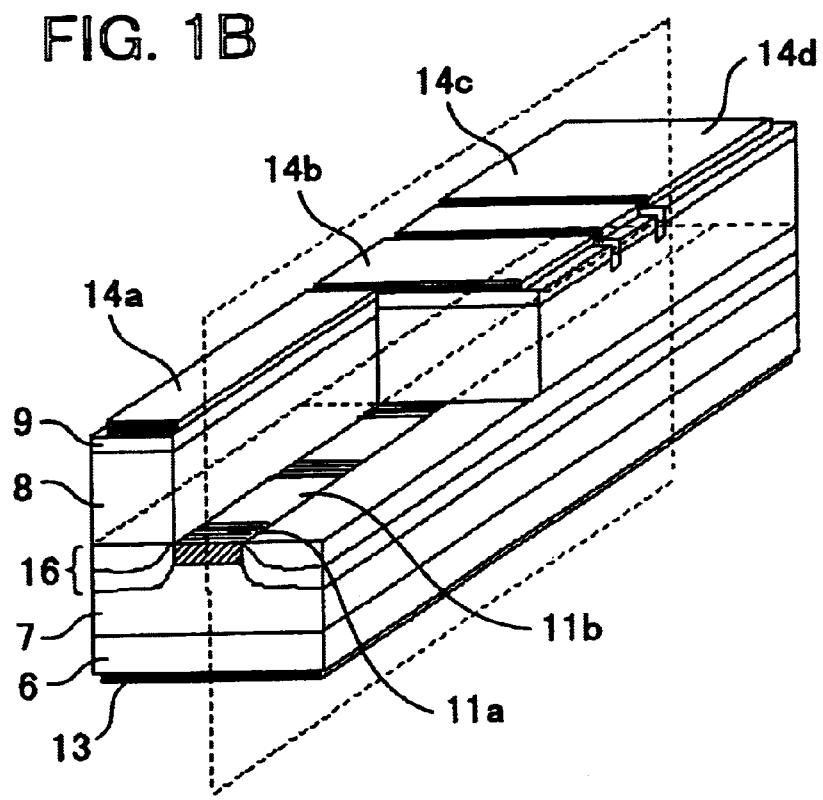
FIG. 1B is a schematic diagram of the device structure of FIG. 1A.

FIG. 1A is a cross-sectional view taken along a laser beam emitting direction of a wavelength-tunable semiconductor laser according to a first embodiment of the present invention, and FIG. 1B is a schematic view showing the wavelength-tunable semiconductor laser shown in FIG. 1A. In FIGS. 1A and 1B, reference numeral 1 represents an active region; 2, a front light reflection area; 3, a rear light reflection area; 4, a phase control area; 5, an optical waveguide formed of InGaAsP; 6, an n-type InP substrate; 7, an n-type InP cladding layer; 8, a p-type cladding layer; 9, a p-type InGaAsP contact layer; 10, one period when a pair of diffraction grating portion and non-diffraction grating portion of an SG-DBR mirror constituting the front light reflection area is set as an unit; 11a, a diffraction grating portion of the SG-DBR mirror constituting the front light reflection area; 11b, a non-diffraction grating portion of the SG-DBR constituting the front light reflection area; 12, variation of the pitch of the diffraction grating of an SSG-DBR mirror constituting the rear light reflection area, that is, one period for modulation; 13, an n-type electrode; 14a, 14b, 14c, 14d, an p-type electrode; 15, a laser beam emitted from the front facet of the wavelength-tunable semiconductor laser to the outside; and 16, a current confinement layer.

An InGaAsP-based compound semiconductor formed on an InP substrate is used as the constituent material of the wavelength-tunable semiconductor laser.

The wavelength-tunable semiconductor laser of this embodiment is different from the conventional SSG-DBR wavelength-tunable semiconductor laser in that a sampled grating, that is, an SG-DBR mirror is used in place of the conventional SSG-DBR mirror in the front light reflection area 2.

Next, the operation of the wavelength-tunable semiconductor laser according to the first embodiment of the present invention will be described. In the wavelength-tunable semiconductor laser of the first embodiment, the active region 1, the front light reflection area 2, the rear light reflection area 3 and the phase control area 4 constitute one optical resonator having front and rear light reflection mirrors and an optical waveguide 5 for laser oscillation in combination. Further, the p-type electrodes 14a, 14b, 14c, 14d are formed in the vicinity of the front light reflection area 2, the active region 1, the phase control area 4 and the rear light reflection area 3 so as to be electrically separated from one another.

When a forward bias voltage is applied across the p-type electrode 14b and the n-type electrode 13 that are mounted over the active region 1 so as to be electrically separated from each other, the active-layer current is injected into the active region 1, and spontaneous emission light occurs over a broad wavelength range in the active region 1. The spontaneous emission light propagates through the optical waveguide 5 formed in the optical resonator while repetitively reflected and amplified by the front SG-DBR mirror formed in the front light reflection area 2 and the rear SSG-DBR mirror formed in the rear light reflection area 3, and then any one wavelength is finally selected and controlled by any one or both of the front light reflection area 2 and the rear light reflection area 3 and the current injection into the phase control area 4, so that laser oscillation of a single wavelength occurs by some threshold current.

Next, the laser oscillation wavelength control of the wavelength-tunable semiconductor laser of the first embodiment according to the present invention will be described in more detail.

Figure 2A:
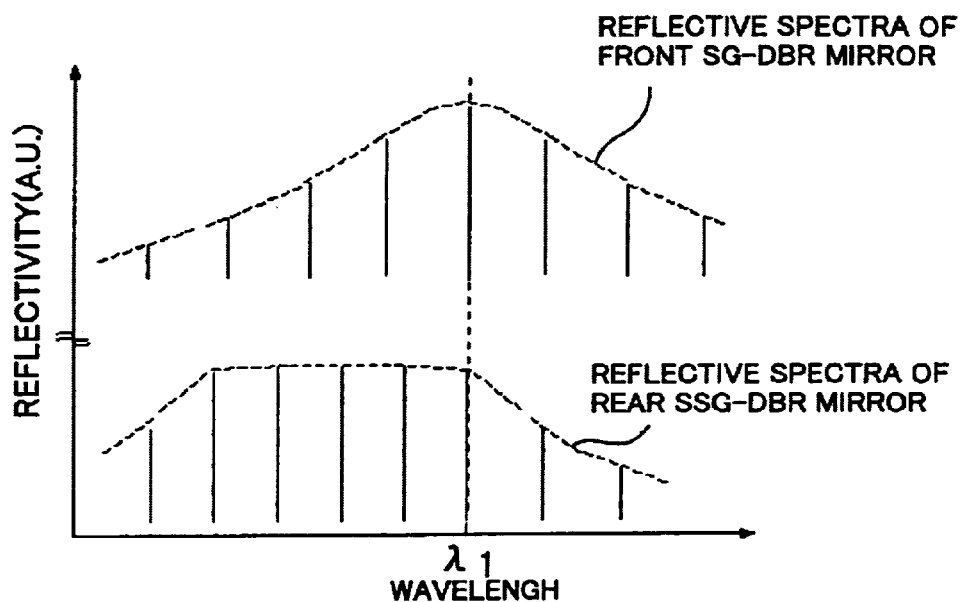
FIG. 2A is a diagram showing a reflection peak spectrum of a front SG-DBR mirror and a reflection peak spectrum of a rear SSG-DBR mirror when no current is injected into each of the front and rear light reflection areas in the wavelength-tunable semiconductor laser according to the first embodiment.
Figure 2B:
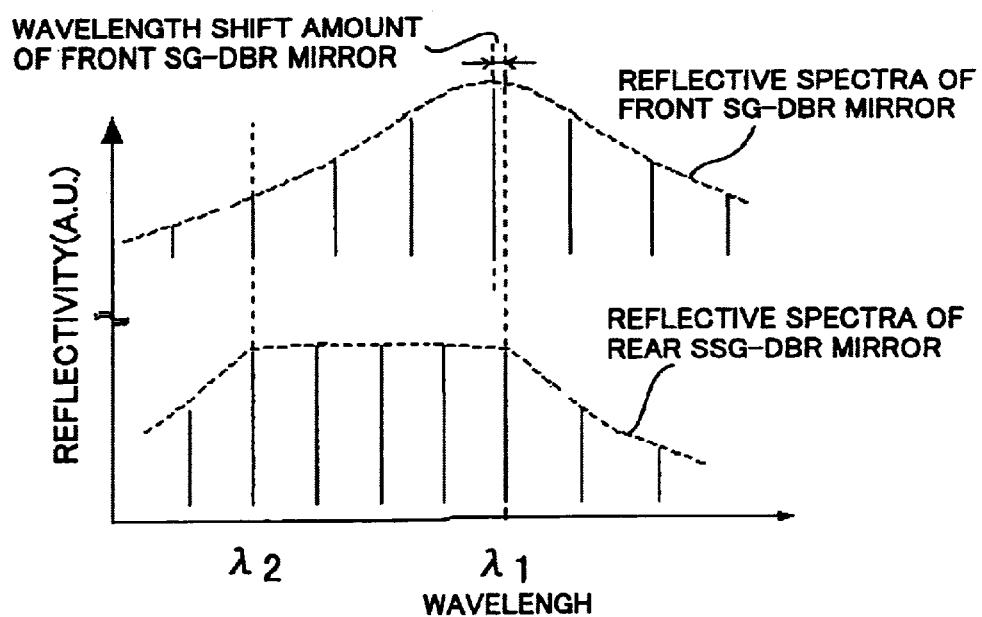
FIG. 2B is a diagram showing a reflection peak spectrum of the rear SSG-DBR mirror when current is injected to the rear light reflection area, and a reflection peak spectrum of the front SG-DBR mirror when no current is injected, in the wavelength-tunable semiconductor laser according to the first embodiment.

FIG. 2A is a diagram showing the reflection peak spectrum of the front SG-DBR mirror occurring in the area 2 and the reflection peak spectrum of the rear SSG-DBR mirror occurring in the area 3 when no current is injected into the front and rear light reflection areas 2 and 3, and FIG. 2B is a diagram showing the comparison between the reflection peak spectrum of the rear SSG-DBR mirror when current is injected into the rear light reflection area 3, and the reflection peak spectrum of the front SG-DBR mirror when no current is injected.

In FIGS. 2A and 2B, the abscissa represents the wavelength, and the ordinate represents the reflectivity. As is apparent from FIGS. 2A and 2B, reflection peaks having remarkably narrow line widths are arranged at a constant wavelength interval. In FIGS. 2A and 2B, $\lambda_1$ represents a wavelength at which the reflection peak spectra of the front and rear mirror reflection mirrors are coincident with each other when no current is injected in the front and rear light reflection areas 2 and 3, and $\lambda_2$ represents a wavelength at which the reflection peak spectra of the front and rear mirrors are coincident with each other when current is injected in the rear light reflection area 3. The reflection peak spectrum of the front light reflection area 2 exhibits a reflection peak spectrum inherent to the SG-DBR mirror, that is, a reflection peak spectrum having such a shape that the reflection peak intensity is monotonically reduced from the center reflection peak to both the sides.

As described above, FIG. 2A shows the reflection peak spectrum in the initial state that both the front SG-DBR mirror injection current and the rear SSG-DBR mirror injection current are equal to zero. In this case, the wavelength at which the reflection peak spectra of the front SG-DBR mirror and the rear SSG-DBR mirror formed in the front light reflection area 2 and the rear light reflection area 3 respectively are coincident with each other is equal to $\lambda_1$. The loss at the wavelength $\lambda_1$ is extremely smaller as compared with the laser beams having the other wavelengths. Therefore, the gain of the laser beam having the wavelength $\lambda_1$ is relatively increased, so that the wavelength-tunable semiconductor laser of this embodiment induces laser oscillation at the wavelength $\lambda_1$.

In order to intentionally tune the oscillation wavelength of the wavelength-tunable semiconductor laser according to this embodiment, a forward bias voltage is applied to any one or both of the front light reflection area 2 and the rear light reflection area 3 to inject current into each area, thereby equivalently varying the refractive index of the front light reflection area 2 and/or the rear light reflection area 3 by a free carrier plasma effect. FIG. 2B shows an example in which current is injected in only the rear light reflection area 3. The reflection peak spectrum of the rear SSG-DBR mirror is shifted to the short wavelength side due to the reduction in refractive index which is caused by the current injection in the rear SSG-DBR mirror, and the wavelength at which the reflection peak spectra of the front SG-DBR mirror and the rear SSG-DBR mirror are coincident with each other is tuned from the wavelength $\lambda_1$ (no current injection case) to the wavelength $\lambda_2$ so that the laser beam having the wavelength $\lambda_2$ propagates through the optical resonator with being amplified and finally the laser oscillation at the wavelength $\lambda_2$ is induced. The laser oscillation wavelength can be tuned in the same manner when current is injected in only the front light reflection area 2 or when current is injected into each of the front light reflection area 2 and the rear light reflection area 3. As described above, the laser oscillation wavelength can be freely tuned by injecting current into any one or both of the light reflection areas 2, 3 and controlling the current injection level to vary the refractive index.

FIG. 2B also shows the wavelength-dependence of the reflection peak of the diffraction grating of each of the front and rear mirrors in the wavelength-tunable semiconductor laser according to the first embodiment. In the case of the front SG-DBR mirror, the reflection peak has a center mode as the maximum value and monotonically decreases at both the sides. In the case of the rear SSG-DBR mirror, the frequency (number) of periods (periodically repetitive-units) of SSG is set to a predetermined value or more to increase the reflectivity at maximum, whereby plural reflection peaks in the vicinity of the center are made uniform in intensity.

Figure 3:
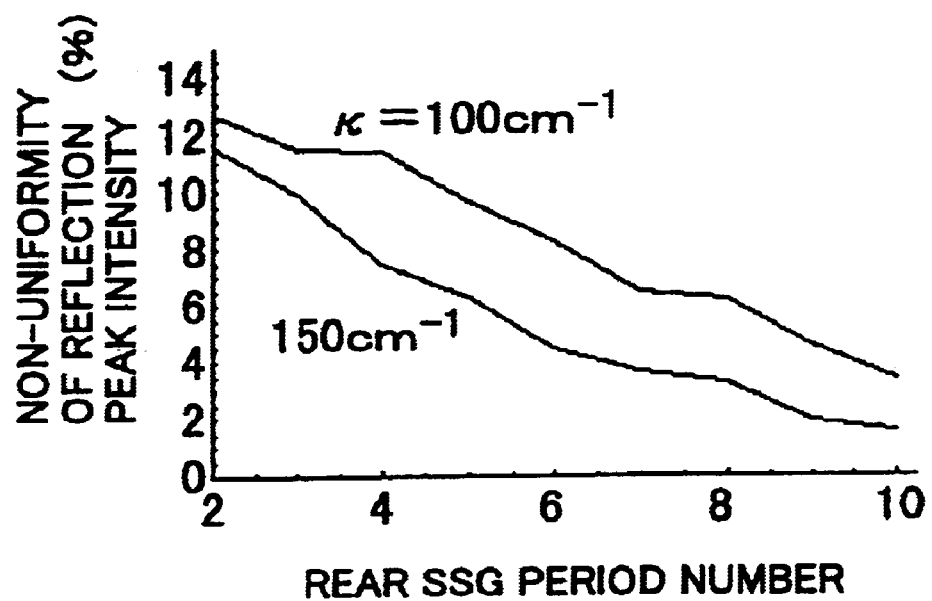
FIG. 3 is a diagram showing the relationship between the non-uniformity of reflection peak intensity in the SSG-DBR mirror and the repetitive frequency of the period in the rear light reflection area, which is simulated by using a coupling coefficient $\kappa$ as a parameter.

FIG. 3 is a graph showing the relationship between the non-uniformity of the reflection peak intensity in the SSG-DBR mirror and the repetitive frequency of the period 12 in the rear light reflection area 3, which is simulated by using a coupling coefficient κ as a parameter. Here, the coupling coefficient κ represents the coupling degree per unit length in which the respective laser beams propagating in the opposite directions are diffracted by a diffraction grating and then combined with each other. As is apparent from FIG. 3, as the coupling coefficient κ is increased, that is, the reflectivity is increased, or as the repetitive frequency of the period 12 is increased, the non-uniformity in intensity between the reflection peaks is more moderated, so that a flat reflection peak spectrum is achieved. From the viewpoint of practical use, the non-uniformity in intensity between the reflection peaks is preferably equal to 10% or less. However, in order to satisfy this condition, it is apparent from the simulation result of FIG. 3 that the repetitive frequency of the period 12 is equal to 5 or more for the coupling coefficient κ of 100 cm$^{-1}$ and to 3 or more for the coupling coefficient κ of 150 cm$^{-1}$. With this structure, it is unnecessary to increase the reflectivity of the front SG-DBR mirror because the reflectivity of the rear SSG-DBR mirror is set to a higher value than that of the conventional structure.

On the other hand, the front SG-DBR mirror has such a property that the reflection peak intensity has the maximum value with respect to the wavelength, and the reflection peak intensity decreases monotonically at both the sides of the maximum value as described above. Therefore, the front SG-DBR mirror has no random variation in the reflection peak spectrum like the SSG-DBR mirror, so that the laser oscillation wavelength can be more stably controlled as compared with the conventional wavelength-tunable semiconductor laser constructed by only the SSG-DBR mirror. Further, as compared with the wavelength-tunable semiconductor laser constructed by only the SG-DBR mirror, the rear reflectivity can be set to a higher value because the rear side is constructed by the SSG-DBR mirror. Therefore, the laser oscillation can be induced by a lower threshold current, and a wavelength-tunable semiconductor laser having high efficiency can be achieved.

The phase control area 4 is provided to minutely adjust the phase of the laser beam and thus stabilize the laser oscillation by applying a forward bias voltage to the phase control area 4 to inject current into the area 4.

Figure 4A:
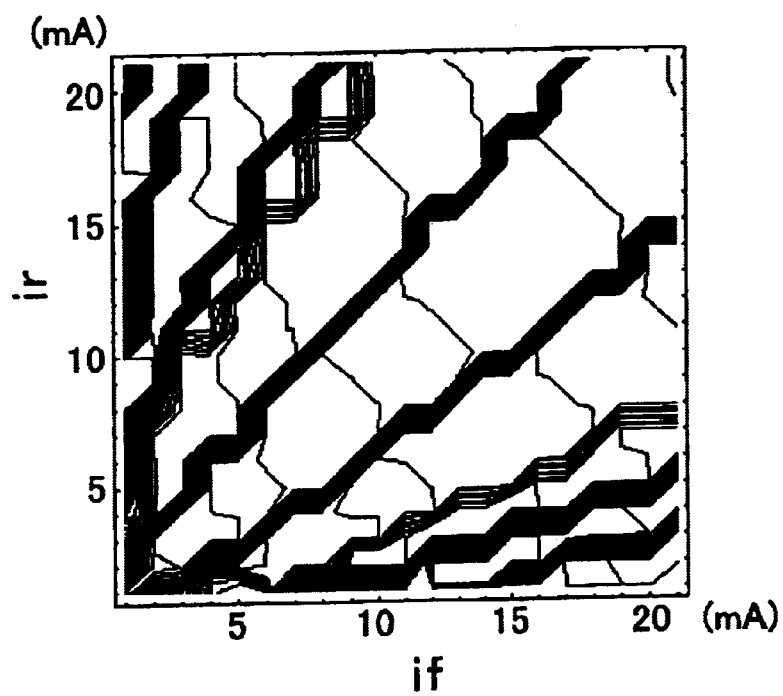
FIGS. 4A and 4B are graphs showing calculated laser oscillation wavelengths of a conventional SSG-DBR wavelength-tunable semiconductor laser (FIG. 4A) and the wavelength-tunable semiconductor laser according to the first embodiment (FIG. 4B) which are two-dimensionally represented as functions of injection current ($i_f$, $i_r$) in the front and rear light reflection areas by contour lines.
Figure 4B:
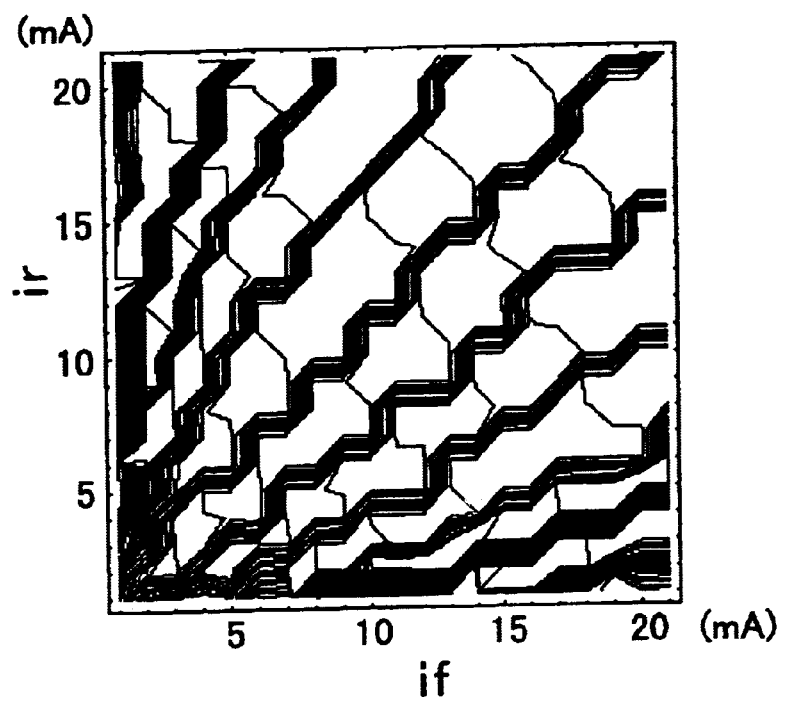

FIGS. 4A and 4B are graphs showing calculated laser oscillation wavelengths of a conventional wavelength-tunable semiconductor laser (FIG. 4A) and the wavelength-tunable semiconductor laser according to the first embodiment (FIG. 4B) which are two-dimensionally represented as functions of injection current ($i_f$, $i_r$) in the front and rear light reflection areas by contour lines. A constant laser oscillation wavelength range corresponds to one surrounded area (domain). That is, as each domain is more uniform, the wavelength stability is more excellent. On the other hand, in an area where the domain area is non-uniform or an intricate boundary exists between domains, the laser oscillation wavelength is easily tuned due to slight fluctuation of the refractive index variation to the same injection current or variation of the device driving condition, so that it is difficult to stabilize the laser oscillation wavelength for a long term. Comparing the relationship between the injection current $i_f$ and the injection current $i_r$ of the wavelength-tunable semiconductor laser of the first embodiment shown in FIG. 4B with that of the conventional wavelength-tunable semiconductor laser constructed by only the SSG-DBR mirrors shown in FIG. 4A, the boundary between domains is smoother and the area of each domain is more uniform in the wavelength-tunable semiconductor laser of the first embodiment, so that the stabilization of the laser oscillation wavelength can be more easily performed.

Figure 5A:
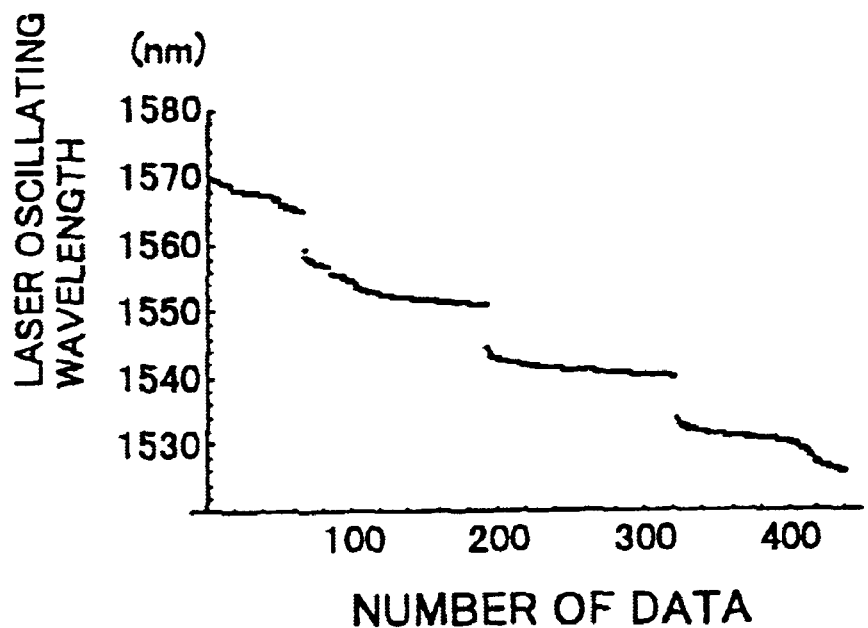
FIGS. 5A and 5B show calculation results of laser oscillation wavelengths when $i_f$, $i_r$ is varied by every 1 mA in the range from 0 to 20 mA in the conventional SSG-DBR wavelength-tunable semiconductor laser (FIG. 5A) and the wavelength-tunable semiconductor laser of the first embodiment (FIG. 5B), that is, calculation results of laser oscillation wavelengths for each of combinations of $i_f$ and $i_r$ (that is, 21×21=441 combinations) which are arranged so that a variation which is as continuous as possible is achieved with respect to the laser oscillation wavelength.
Figure 5B:
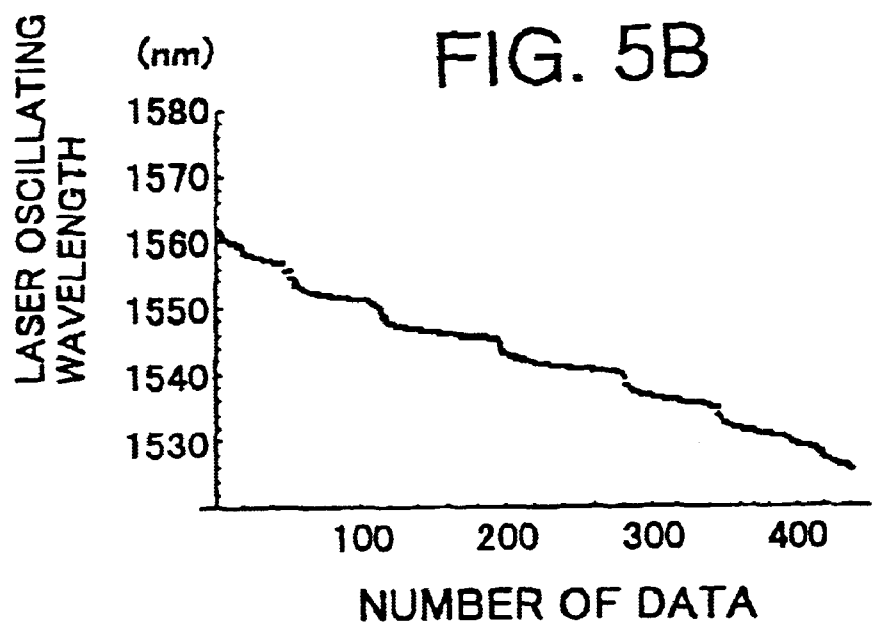

FIGS. 5A and 5B show calculation results of laser oscillation wavelengths when $i_f$, $i_r$ is varied by every 1 mA in the range from 0 to 20 mA in the conventional wavelength-tunable semiconductor laser constructed by only the SSG-DBR mirrors (FIG. 5A) and the wavelength-tunable semiconductor laser of the first embodiment (FIG. 5B), that is, calculation results of laser oscillation wavelengths for each of combinations of $i_f$ and $i_r$ (that is, 21×21=441 combinations) which are arranged so that a variation which is as continuous as possible is achieved with respect to the laser oscillation wavelength.

As is apparent from FIG. 5A, in the conventional wavelength-tunable semiconductor laser constructed by only the SSG-DBR mirrors, discontinuous variation appears in some wavelength range. On the other hand, as is apparent from FIG. 5B, in the wavelength-tunable semiconductor laser of the first embodiment, the variation is substantially smooth and continuous and the wavelength stability is more excellent as compared with the conventional wavelength-tunable semiconductor laser.

Figure 6A:
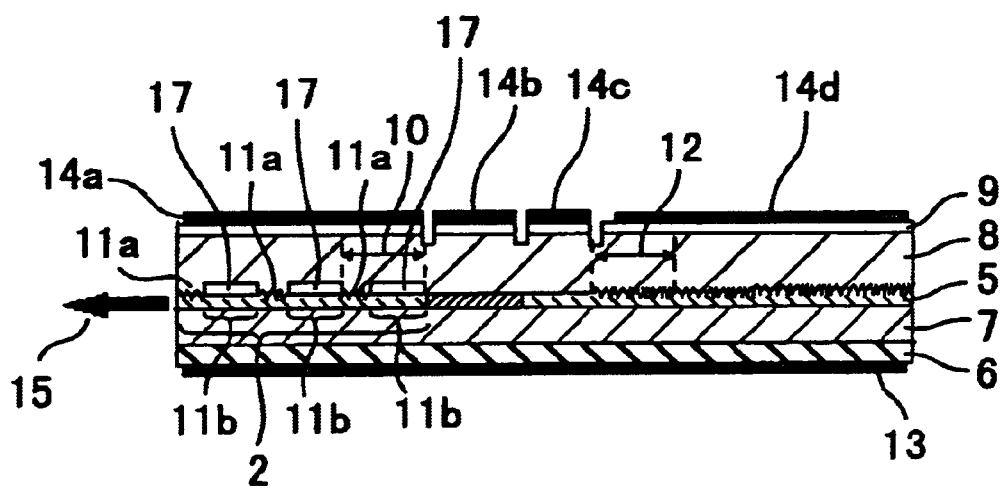
FIG. 6A is a cross-sectional view showing a device structure of a modification of the wavelength-tunable semiconductor laser according to the first embodiment, in which a current blocking area is provided on the non-diffraction grating portion in the front light reflection area.
Figure 6B:
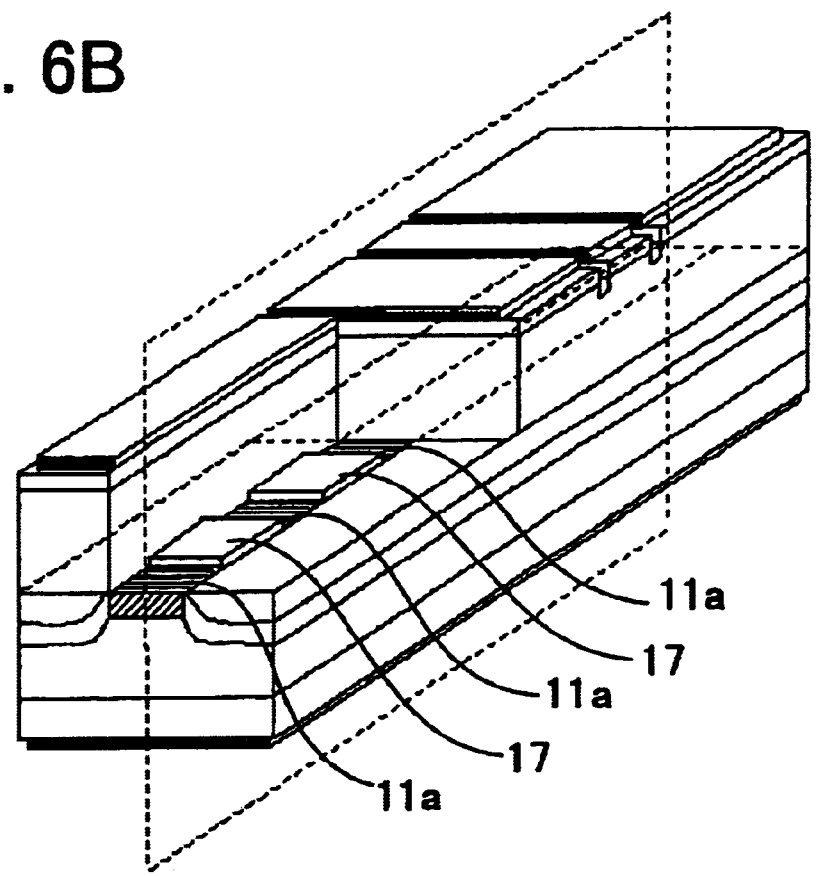
FIG. 6B is a schematic diagram showing the device structure of FIG. 6A.

FIGS. 6A and 6B show a modification of the wavelength-tunable semiconductor laser according to the first embodiment of the present invention, and specifically FIG. 6A is a cross-sectional view showing a device structure in which a current blocking area 17 is provided on the upper portion of the non-diffraction grating portion in the front light reflection area, and FIG. 6B is a schematic view of the device structure. In this device structure, diffraction grating portions 11a and non-diffraction grating portions 11b with a current blocking area 17 formed on the upper portion thereof are alternately formed at predetermined intervals in the front light reflection area 2. Each current blocking area 17 has a current blocking property, and thus injection current into the non-diffraction grating portions 11b is prevented. Even when current flows into the non-diffraction grating portions 11b, it does not contribute to the wavelength tuning operation. Accordingly, the formation of the current blocking area 17 as described above prevents invalid current components, thereby achieving a wavelength-tunable semiconductor laser which can operate with high efficiency by using a lower threshold current.

[Second Embodiment]

Figure 7A:
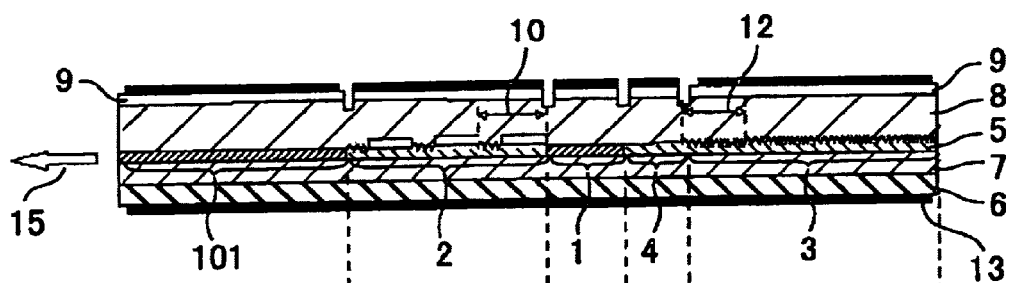
FIG. 7A is a cross-sectional view of a wavelength-tunable semiconductor laser according to a second embodiment which is taken along the optical axis direction of the laser.
Figure 7B:
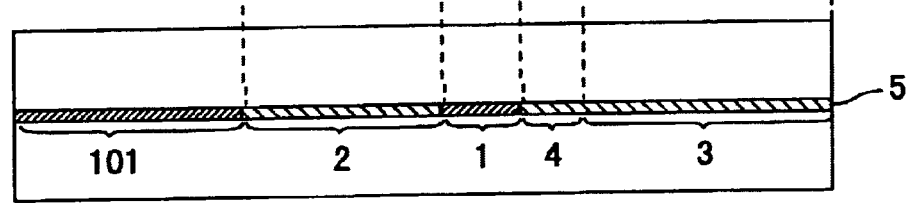
FIG. 7B is a top view of the wavelength-tunable semiconductor laser of the second embodiment.

FIG. 7A is a cross-sectional view of a wavelength-tunable semiconductor laser according to a second embodiment of the present invention, which is taken along the optical axis direction of the laser. This embodiment is different from the first embodiment in that a laser beam amplifying area 101 formed of a crystal composition that can amplify an emitted laser beam. FIG. 7B is a schematic diagram showing an optical waveguide 5 when the wavelength-tunable semiconductor laser is viewed from the upper side in the same plane as the optical waveguide 5. With respect to the optical waveguide 5, the respective areas are jointed to one another at the same optical waveguide width.

In order to transmit a laser beam through an optical fiber to a farther place by using a wavelength-tunable semiconductor laser, it is preferable that the optical output is as high as possible to overcome the optical loss in the optical fiber. However, in the optical waveguide structure of the wavelength-tunable semiconductor laser of the first embodiment, the optical waveguide width of the optical waveguide 5 must be set to a predetermined width or less in order to keep the horizontal lateral mode to the fundamental mode. In this case, the optical output is restricted by the level at which it is saturated at a predetermined optical density in the optical waveguide 5.

Therefore, if the laser beam amplifying area 101 functioning to optically amplify the laser beam is provided between the front facet at the front face of the optical waveguide 5 and the SG-DBR mirror serving as the front light reflection area 2 and the laser beam generated in the active region 1 is optically amplified by the laser beam amplifying area 101 as in the case of the wavelength-tunable semiconductor laser of the second embodiment, the saturation level of the laser beam can be more enhanced as compared with the wavelength-tunable semiconductor laser having no laser beam amplifying area 101 as described above, so that a wavelength-tunable semiconductor laser that can operate with high optical output can be achieved.

[Third Embodiment]

Figure 8A:
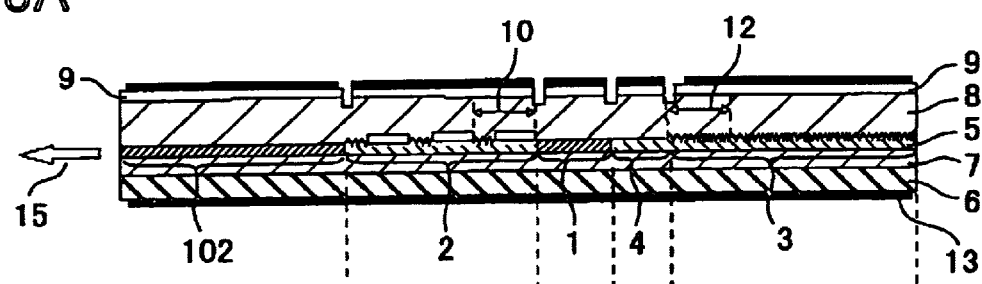
FIG. 8A is a cross-sectional view showing a wavelength-tunable semiconductor laser according to a third embodiment which is taken along the optical axis direction of the laser.
Figure 8B:
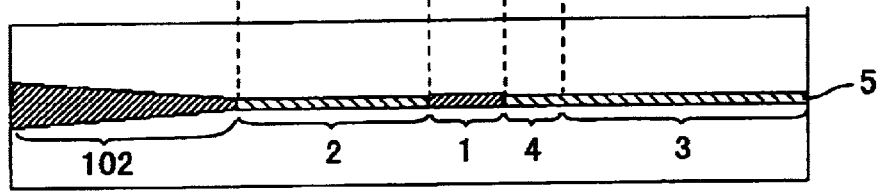
FIG. 8B is a top view of the wavelength-tunable semiconductor laser of the third embodiment.

FIG. 8A is cross-sectional view taken along the optical axis direction of a wavelength-tunable semiconductor laser according to a third embodiment of the present invention, and FIG. 8B is a top view of the wavelength-tunable semiconductor laser of the third embodiment.

As compared with the second embodiment, the optical waveguide width of the laser beam amplifying area, that is, the stripe width is gradually expanded as it approaches to the front facet like a taper shape 102. In the wavelength-tunable semiconductor laser of the second embodiment, the optical output of the laser beam can be enhanced. However, an optical saturation due to the saturation of the optical amplification factor of the laser beam amplifying area 101 occurs finally, so that the optical output at the stage that the optical saturation as described above occurs is equal to the maximum optical output. In order to overcome this restriction and achieve higher output power, the volume of the optical waveguide 5 is increased by increasing the optical waveguide width in the horizontal direction with respect to the semiconductor substrate 6. However, when the optical waveguide width is simply increased, a higher mode would be more liable to occur in the horizontal lateral mode if the optical waveguide width is equal to a predetermined value or more, and consequently there occurs a disadvantage that a laser beam shape having a single peak is not achieved.

Therefore, if the laser beam amplifying area is designed in a tapered shape 102 like this embodiment in order to prevent such a disadvantage, the laser beam emitted from the active region 1 propagates while it is gradually expanded as it approaches to the front facet in the tapered laser beam amplifying area 102. Therefore, this brings such a remarkable effect that the maximum optical output at which the saturation of the optical amplification factor occurs in the laser beam amplifying area 102 due to increase of the effective optical waveguide width is more enhanced with keeping the stable fundamental horizontal lateral mode as compared with the maximum optical output of the wavelength-tunable semiconductor laser of the second embodiment.

[Fourth Embodiment]

Figure 9A:
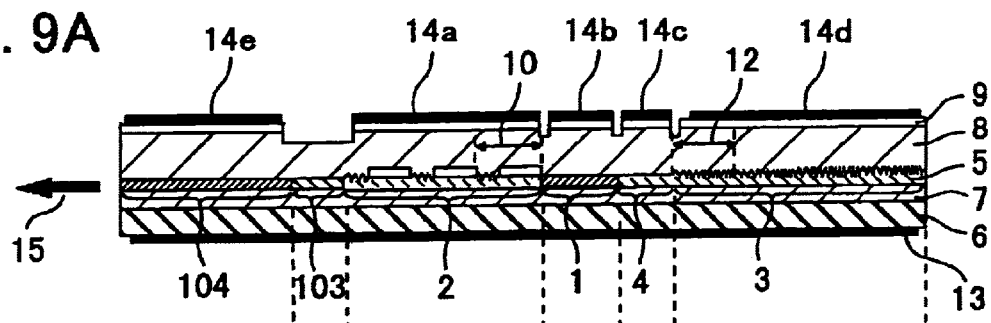
FIG. 9A is a cross-sectional view of a wavelength-tunable semiconductor laser according to a fourth embodiment which is taken along the optical axis direction of the laser.
Figure 9B:
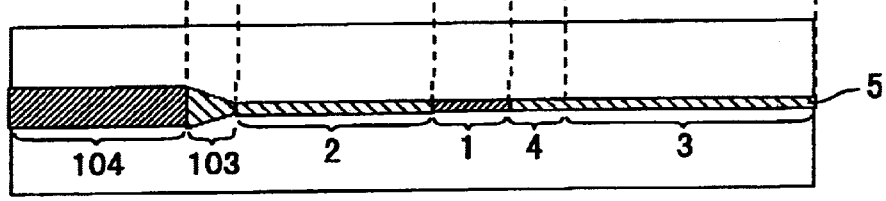
FIG. 9B is a top view of the wavelength-tunable semiconductor laser of the fourth embodiment.

FIG. 9A is a cross-sectional view taken along the optical axis direction of a wavelength-tunable semiconductor laser according to a fourth embodiment of the present invention, and FIG. 9B is a top view of the wavelength-tunable semiconductor laser of the fourth embodiment.

In FIGS. 9A and 9B, reference numeral 14e represents a p-type electrode on the laser beam amplifying area. As compared with the first embodiment, a mode expansion area 103 in which the optical waveguide width is gradually expanded as it approaches to the front facet like a taper shape is provided so as to be adjacent to the front light reflection area 2 at the front side, and a laser beam amplifying area 104 that is formed so as to have the width coincident with the optical waveguide width at the most expanded portion in the mode expansion area is provided so as to extend to the front facet.

In the wavelength-tunable semiconductor laser according to the fourth embodiment, the laser beam emitted from the active region 1 is temporarily expanded in the horizontal direction in the mode expansion area 103 with keeping the fundamental horizontal lateral mode, and further propagates to the laser beam amplifying area 104 with keeping the laser beam shape thus expanded. Therefore, the fundamental horizontal lateral mode can be kept in the laser beam amplifying area 104, and the saturation of the optical amplification factor in the laser beam amplifying area 104 can be prevented by the degree corresponding to the increase of the optical waveguide width, so that the high-output operation can be performed.

Further, since no p-type electrode is formed over the mode expansion area 103, no current is injected in the area 103. That is, the mode expansion area 103 is only a passive area, and thus there can be achieved such an effect that the laser beam can be expanded more stably along the taper shape with keeping the horizontal lateral-mode to the fundamental mode.

For convenience of description, the active region 1 is formed of InGaAsP in the above embodiments. However, the constituent material of the active region 1 is not limited to InGaAsP. For example, the same effect can be achieved if it is formed of AlGaAs.

[Fifth Embodiment]

Figure 10:
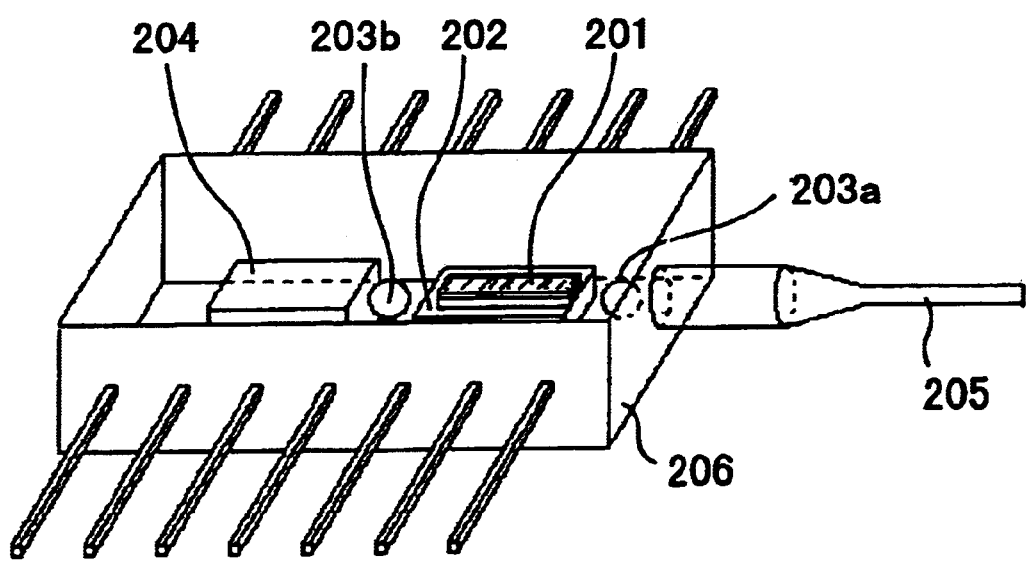
FIG. 10 schematically shows an optical module according to a fifth aspect of the present invention.
Figure 11:
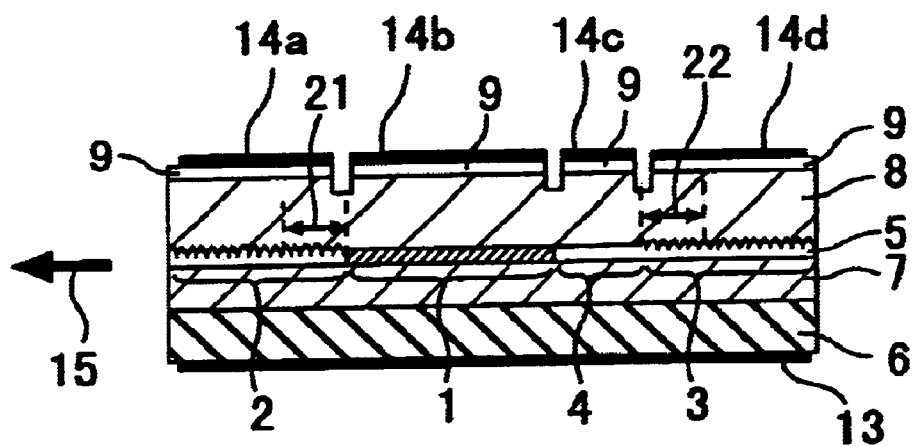
FIG. 11 is a cross-sectional view of a conventional SSG-DBR wavelength-tunable semiconductor laser in the optical axis direction thereof.
Figure 12A:
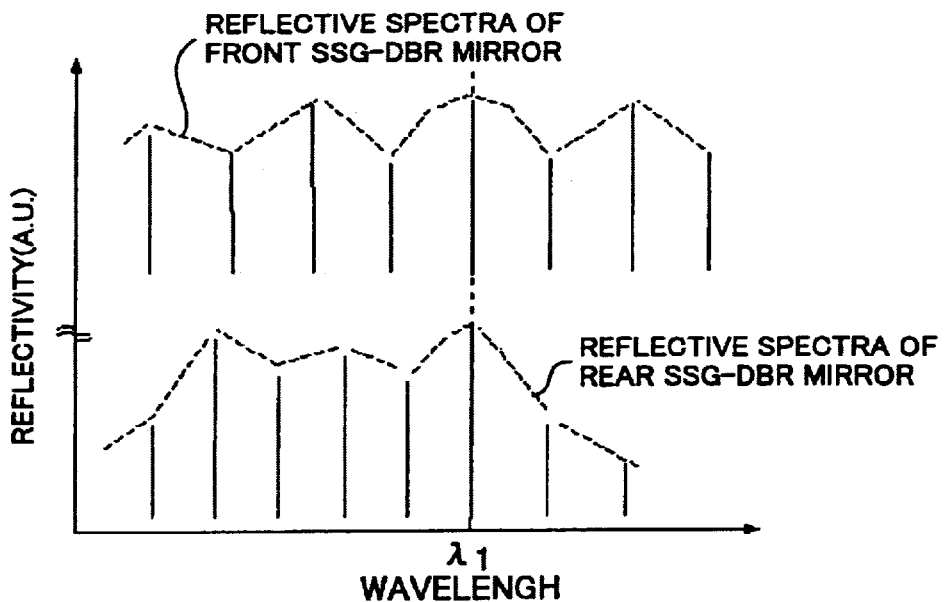
FIG. 12A is a diagram showing the reflection peak spectra of a front SSG-DBR mirror and a rear SSG-DBR mirror formed in front and rear light reflection areas of the conventional wavelength-tunable semiconductor laser when no current is injected into the front light reflection area and the rear light reflection area.
Figure 12B:
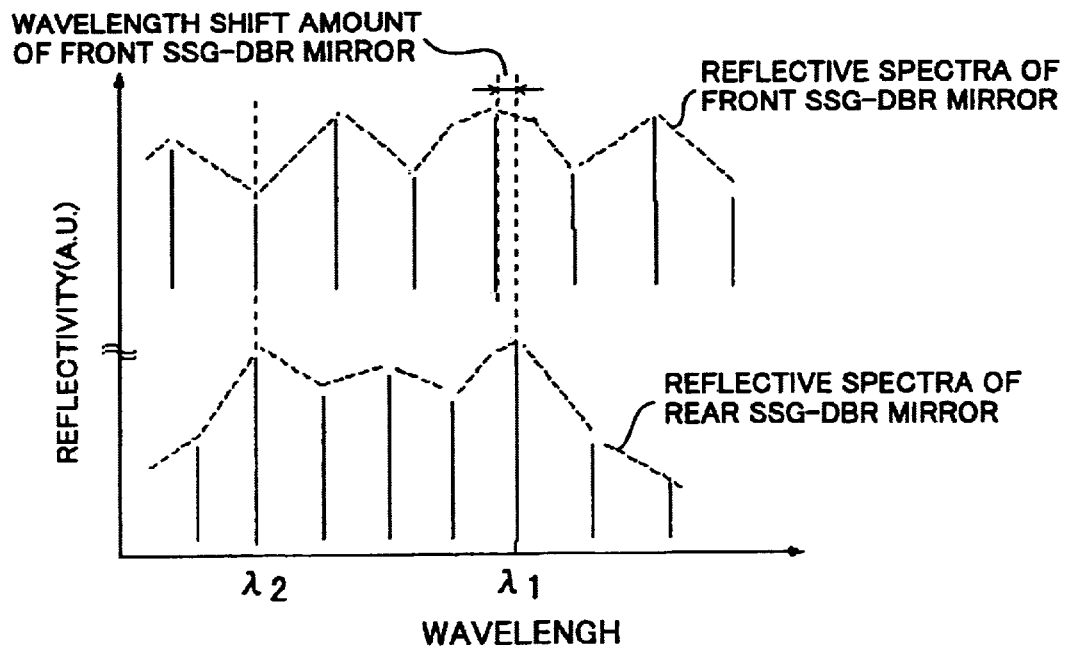
FIG. 12B is a diagram showing the comparison between the reflection peak spectrum of the rear SSG-DBR mirror when current is injected into the rear light reflection area in the conventional SSG-DBR wavelength-tunable semiconductor laser and the reflection peak spectrum of the front SSG-DBR mirror of the front light reflection area when no current is injected.
Figure 13:
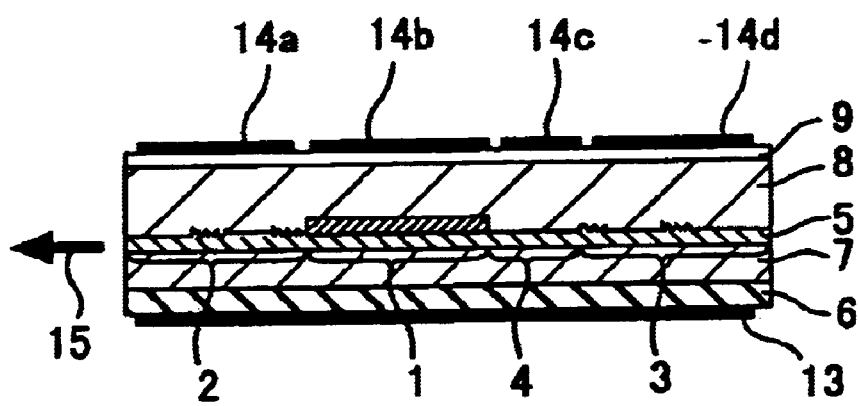
FIG. 13 is a cross-sectional view of a conventional SG-DBR wavelength-tunable semiconductor laser in the optical axis direction.

Next, an optical module of a fifth embodiment according to the present invention will be described. FIG. 10 is a schematic diagram showing an optical module of a fifth embodiment. The optical module of this embodiment is achieved as follows. That is, after any one of the wavelength-tunable semiconductor lasers 201 of the first to fourth embodiments is mounted on a heat sink 202, the heat sink 202 having the wavelength-tunable semiconductor laser 201, a focusing lenses 203a, 203b, a wavelength monitor 204 and an optical fiber 205 are integrally fixed to a housing 206.

When a forward voltage is applied to each electrode of the wavelength-tunable semiconductor laser 201 through wires (not shown) to supply current that is controlled to have a desired current value, the laser beam having the wavelength corresponding to the current value is emitted from the wavelength-tunable semiconductor laser beam 201. The laser beam thus emitted is temporarily focused by the focusing lens 203a, and then incident into the optical fiber 205. Likewise, the laser beam emitted from the rear facet at the opposite side of the wavelength-tunable semiconductor laser 201 is temporarily focused by the focusing lens 203b, and incident to the wavelength monitor 204 in which the laser wavelength of the incident laser beam is analyzed, so that the laser beam wavelength can be monitored from the outside of the optical module at all times. In the optical module thus constructed, the above-described wavelength-tunable semiconductor laser in which the wavelength can be stably tuned is used as a light source, so that there can be achieved an effect that a laser beam having excellent wavelength stability can be achieved as the output of the optical fiber.

In this embodiment, the wavelength monitor 204 is not necessarily required to be disposed at the rear side of the wavelength-tunable semiconductor laser 201, and a photodiode or the like may be disposed.

The wavelength-tunable semiconductor laser of the present invention is equipped with the semiconductor substrate, the optical waveguide provided over the upper surface of the semiconductor substrate, the front light reflection area formed of the SG-DBR mirror that is provided at the front side in the laser beam emission direction by a part of the optical waveguide and achieved by setting a structure comprising a pair of diffraction grating portion and non-diffraction grating portion as one period and then repeating this structure over plural periods, the rear light reflection area formed of SSG-DBR mirror that is provided at the rear side in the laser beam emission direction by a part of the optical waveguide and achieved by setting as one period a structure in which the pitch of the diffraction grating is regularly varied from one end to the other end, both the ends being spaced at a predetermined distance, and then repeating this structure over plural periods, the active region formed of the active layer that is provided between the front light reflection area and the rear light reflection area by a part of the optical waveguide, and the phase control area formed of the phase control layer that is provided between the front light reflection area and the rear light reflection area by a part of the optical waveguide and varies its refractive index by current injection. Therefore, the wavelength-tunable semiconductor laser thus constructed has excellent wavelength stability when the wavelength is tuned.

Further, in the wavelength-tunable semiconductor laser of the present invention, the current blocking area is formed on the non-diffraction grating portion in the above front light reflection area, so that the wavelength-tunable semiconductor laser achieved has excellent wavelength stability when the wavelength is tuned, and also operate with high efficiency by a low threshold current.

In the wavelength-tunable semiconductor laser of the present invention, the laser beam amplifying area is provided at the front side of the front light reflection area by a part of the optical waveguide, so that the wavelength-tunable semiconductor laser can have excellent wavelength stability when the wavelength is tuned, and also operates with high output power.

In the wavelength-tunable semiconductor laser according to the present invention, the optical waveguide in the above laser beam amplifying area is designed in a tapered shape so that it is gradually expanded in the direction parallel to the semiconductor substrate as it approaches to the front facet, so that the wavelength-tunable semiconductor laser achieved can have excellent wavelength stability when the wavelength is tuned, and also operate with high output power.

Further, the wavelength-tunable semiconductor laser according to the present invention is equipped with the mode expansion area that is provided between the laser beam amplifying area having the predetermined optical waveguide width and the front reflection area by a part of the optical waveguide and also is designed in a tapered shape so that it is gradually expanded in the direction parallel to the semiconductor substrate as it approaches to the laser beam amplifying area, so that the wavelength-tunable semiconductor laser achieved can have excellent wavelength stability when the wavelength is tuned, and operate with high output power.

Still further, the optical module of the present invention is equipped with any one of the above wavelength-tunable semiconductor lasers, the focusing lens for focusing the laser beam emitted from the wavelength-tunable semiconductor laser concerned, the optical fiber for guiding the laser beam thus focused, and the housing in which the above wavelength-tunable semiconductor laser, the focusing lens and the optical fiber are fixed. Therefore, the laser beam having excellent wavelength stability can be achieved as the output of the optical fiber.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A wavelength-tunable semiconductor laser comprising:

a semiconductor substrate;

an optical waveguide at an upper surface of said semiconductor substrate;

a front light reflection area located at a front side, in a laser beam emission direction, of a part of said optical waveguide and comprising a sampled grating-distributed Bragg reflector (SG-DBR) mirror including a structurally repeating first portion, repeated over plural periods between ends of said SG-DBR mirror, with each first portion as one period, each first portion comprising a diffraction grating portion having a diffraction grating and a diffraction grating-free portion free of any diffraction grating;

a rear light reflection area located at a rear side, in the laser beam emission direction, of a part of said optical waveguide and comprising a super structure grating-distributed Bragg reflector (SSG-DBR) mirror including a structurally repeating second portion, repeated over plural periods between ends of said SSG-DBR mirror, with each second portion as one period, each second portion comprising a diffraction grating having a pitch regularly varying within each second portion;

an active region comprising an active layer located between said front light reflection area and said rear light reflection area as a part of said optical waveguide; and a phase control area located between said front light reflection area and said rear light reflection area as a part of said optical waveguide, and comprising a phase control layer having a refractive index varying in response to current injection.

2. The wavelength-tunable semiconductor laser as claimed in claim 1, including a current blocking area on said diffraction grating-free portion in said front light reflection area.

3. The wavelength-tunable semiconductor laser as claimed in claim 1, including a laser beam amplifying area located at the front side of said front light reflection area as a part of said optical waveguide.

4. The wavelength-tunable semiconductor laser as claimed in claim 3, wherein said optical waveguide in said laser beam amplifying area has a tapered shape, gradually expanding in a direction parallel to said semiconductor substrate as said optical waveguide approaches a front facet.

5. The wavelength-tunable semiconductor laser as claimed in claim 3, further comprising a mode expansion area located between said laser beam amplifying area, having an optical waveguide width, and said front light reflection area, as a part of the optical waveguide and having a tapered shape, gradually expanding in a direction parallel to said semiconductor substrate as said mode expansion area approaches said laser beam amplifying area.

6. An optical module comprising:
a wavelength-tunable semiconductor laser including:
a semiconductor substrate,
an optical waveguide at an upper surface of said semiconductor substrate,
a front light reflection area located at a front side, in a laser beam emission direction, of a part of said optical waveguide and comprising a sampled grating-distributed Bragg reflector (SG-DBR) mirror including a structurally repeating first portion, repeated over plural periods between ends of said SG-DBR mirror, with each first portion as one period, each first portion comprising a diffraction grating portion having a diffraction grating and a diffraction grating-free portion free of any diffraction grating,
a rear light reflection area located at a rear side, in the laser beam emission direction, of a part of said optical waveguide and comprising a super structure grating-distributed Bragg reflector (SSG-DBR) mirror including a structurally repeating second portion, repeated over plural periods between ends of said SSG-DBR mirror, with each second portion as one period, each second portion comprising a diffraction grating having a pitch regularly varying within each second portion,
an active region comprising an active layer located between said front light reflection area and said rear light reflection area as a part of said optical waveguide, and
a phase control area located between said front light reflection area and said rear light reflection area as a part of said optical waveguide, and comprising a phase control layer having a refractive index varying in response to current injection,
a focusing lens for focusing laser beams emitted from the wavelength-tunable semiconductor laser;
an optical fiber for guiding the laser beams focused by said focusing lens; and
a housing in which said wavelength-tunable semiconductor laser, said focusing lens, and said optical fiber are measured.

* * * * *